(12) United States Patent
Ma et al.

(10) Patent No.: US 7,008,237 B1
(45) Date of Patent: Mar. 7, 2006

(54) ELECTRICAL CONNECTOR HAVING PROTECTING PROTRUSIONS

(75) Inventors: Hao-Yun Ma, Tu-Chen (TW); Ming-Lun Szu, Tu-Chen (TW)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 11/137,975

(22) Filed: May 25, 2005

(30) Foreign Application Priority Data

Aug. 23, 2004 (CN) .................... 2004200789936 U

(51) Int. Cl.
*H01R 12/00* (2006.01)
(52) U.S. Cl. .......................................... 439/66; 439/71
(58) Field of Classification Search ................ 439/66, 439/71, 525, 526
See application file for complete search history.

(56) References Cited

U.S. PATENT DOCUMENTS

| | | | |
|---|---|---|---|
| 6,345,987 B1 * | 2/2002 | Mori et al. .................... | 439/66 |
| 6,604,950 B1 * | 8/2003 | Maldonado et al. .......... | 439/66 |
| 6,805,561 B1 * | 10/2004 | Walkup et al. ................. | 439/66 |
| 6,824,396 B1 * | 11/2004 | Koopman et al. ............. | 439/71 |
| 6,843,659 B1 * | 1/2005 | Liao et al. ..................... | 439/66 |
| 6,908,313 B1 * | 6/2005 | Walkup et al. ................. | 439/66 |
| 6,921,271 B1 * | 7/2005 | Liao et al. ..................... | 439/66 |

\* cited by examiner

*Primary Examiner*—Gary Paumen
(74) *Attorney, Agent, or Firm*—Wei Te Chung

(57) ABSTRACT

A land grid array connector (10) for electrically connecting a CPU package to a printed circuit board includes a housing (30) having a top surface (320) and a number of terminals received in passageways (31) of the housing. Each of the terminals has a retention portion (52), a spring arm (54) extending from the retention portion beyond the top surface. A contacting portion (58) is formed on a topmost part of the spring arm for electrically mating with a corresponding pad formed on a bottom of the CPU package. A plurality of protrusions (324) is formed on the top surface for protect the terminals from being accidental damaged, A common supporting surface (326) is formed cooperatively by the protrusions, above the contacting portion in a direction perpendicular to the top surface. This can protect the contacting portion of the terminal from being collided. As a result reliable electrical connection between the package and contacts of the land grid array connector is secured.

1 Claim, 5 Drawing Sheets

ELECTRICAL CONNECTOR HAVING PROTECTING PROTRUSIONS

BACKGROUND OF THE INVENTION

1. Field of the Invention

The present invention relates to electrical connectors, and more particularly to a land grid array (LGA) connector for electrically connecting an electronic package such as a CPU chip, to a circuit substrate such as a printed circuit board (PCB).

2. Description of the Prior Art

Land grid array (LGA) electrical connectors are widely used in the connector industry for electrically connecting CPU chips to PCBs. A conventional LGA electrical connector is disclosed in U.S. Pat. No. 6,695,624. The electrical connector generally comprises an insulative housing and a plurality of electrical terminals received in the housing. Each terminal has a relatively long spring arm extending beyond outside the housing, for electrically mating with a corresponding pad on a CPU chip. However, the connector has a shortcoming that there is no protecting means for the terminals. When the connector is collided by an exterior object, the spring arm is prone to be accidental damaged because of undue force generated during the colliding. The terminal being damaged is difficult to effectively mating with the pad on the CPU chip. This can thereby affect reliable electrical connecting between the connector and the CPU chip.

Therefore, a new land grid array electrical connector, which overcomes the above-mentioned disadvantages of the prior art, is desired.

SUMMARY OF THE INVENTION

Accordingly, a main object of the present invention is to provide a new LGA connector with terminals, whereby the connector can protect the terminals from being accidental damaged.

To achieve the aforementioned object, an LGA connector 1 in accordance with a preferred embodiment of the present invention is provided. The connector comprises an insulative housing having a top surface and a plurality of passageways received in the housing. The terminals each have a retention portion secured in the housing and a spring arm extending from the retention portion. A contacting portion is formed at a topmost part of the spring arm, exposing above the top surface a distance in a direction perpendicular to the top surface. A plurality of protrusions is formed on the top surface. Said protrusions project beyond the top surface, for protecting the terminals from collided damage. A common supporting surface is formed on a top of said protrusions, the supporting surface being higher than the contacting portion in the direction perpendicular to the top surface.

Other objects, advantages and novel features of the present invention will become more apparent from the following detailed description when taken in conjunction with the accompanying drawings, in which:

DETAILED DESCRIPTION OF THE PREFERRED EMBODIMENT OF THE INVENTION

Reference will now be made to the drawings to describe the present invention in detail.

Figure 1:
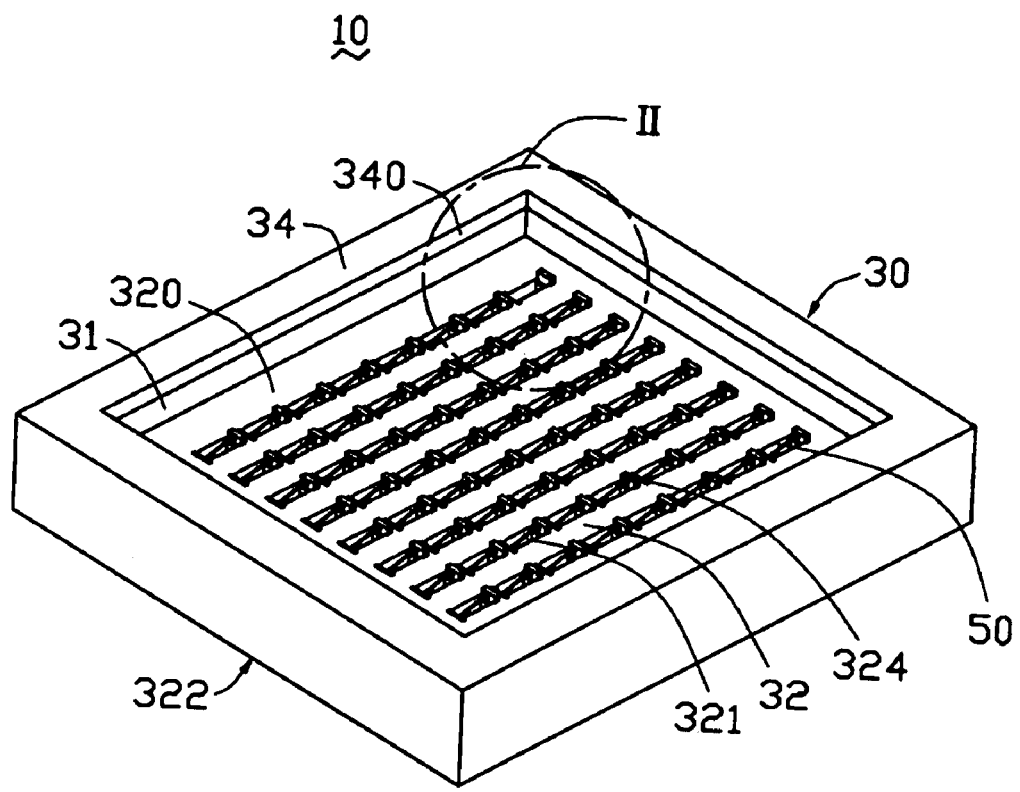
FIG. 1 is an isometric view of an LGA connector in accordance with a preferred embodiment of the present invention, showing terminals received in passageways defined in a housing of the connector respectively.
Figure 4:
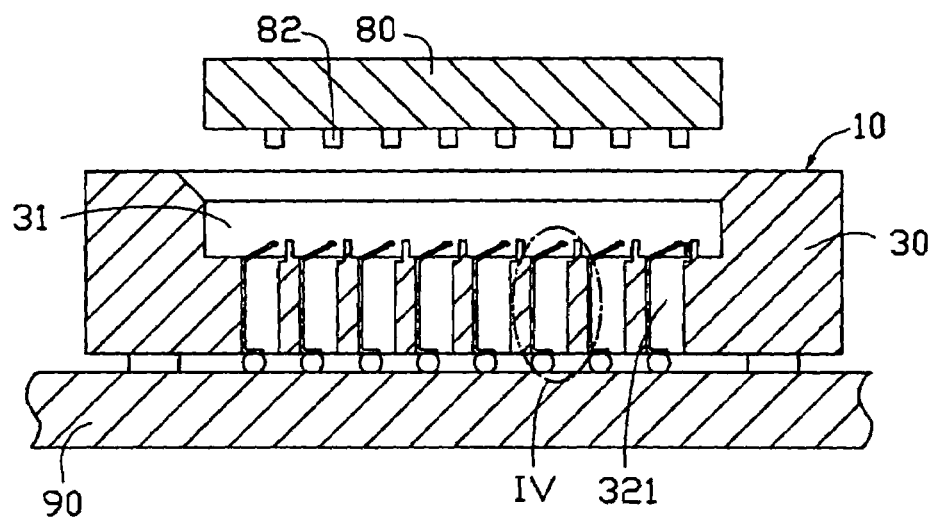
FIG. 4 is a cross-sectional view of the connector of FIG. 1, together with a CPU chip and a PCB, and showing the CPU being ready to be pressed down.
Figure 5:
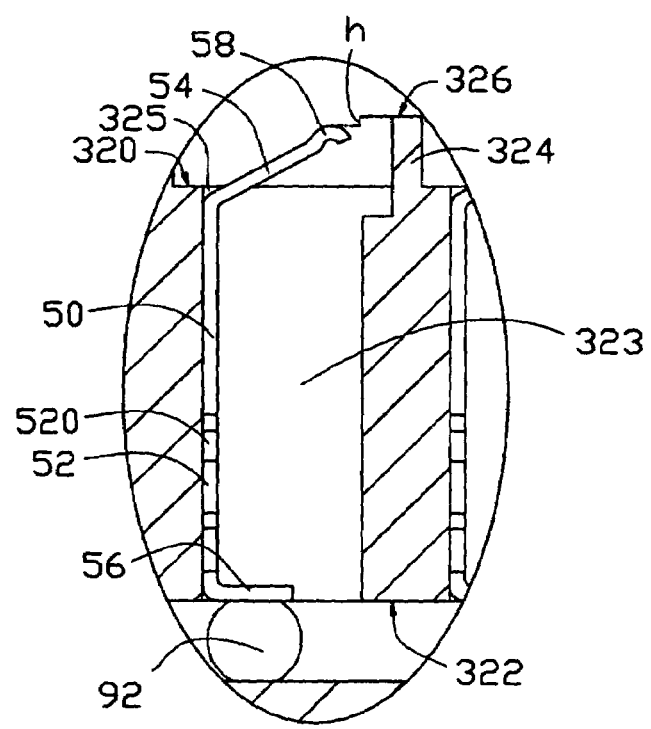
FIG. 5 is an enlarged view of a circled portion V—V of FIG. 4.
Figure 6:
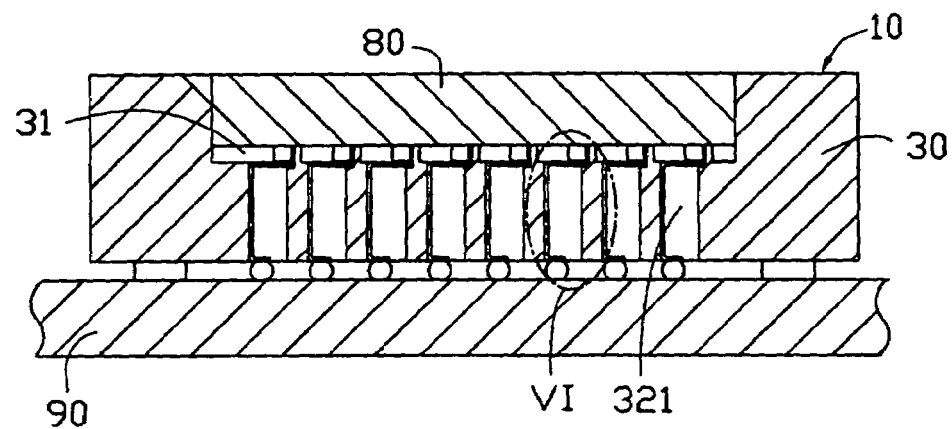
FIG. 6 is similar to FIG. 1, but showing the CPU being pressed down.
Figure 7:
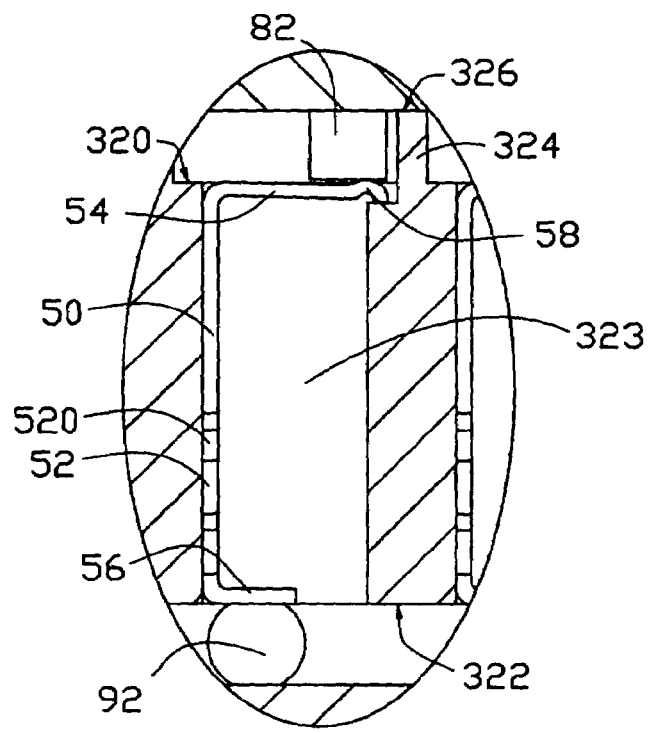
FIG. 7 is an enlarged view of a circled portion VII—VII of FIG. 6.

Referring to FIG. 1, an LGA connector 10 in accordance with a preferred embodiment of the present invention is provided for electrically connecting a CPU chip 80 to a PCB 90 (best seen in FIGS. 4 and 6). The LGA connector 10 may, of course, be applied in other environments such as for electrically interconnecting two PCBs and so on. The connector 10 comprises a rectangular insulative housing 30 and a plurality of terminals 50 received in the housing 30.

The housing 30 is configured with a bottom wall 32 and four side walls 34 extending upwardly from peripheries of the bottom wall 32. A receiving cavity 31 is defined between the bottom wall 32 and the side walls 34, for accommodating the CPU chip 3 therein. Guiding slant surfaces 340 are formed on the side walls 34 around a top mouth of the cavity 31, for facilitating insertion of the CPU package 90 into the cavity 31.

Figure 2:
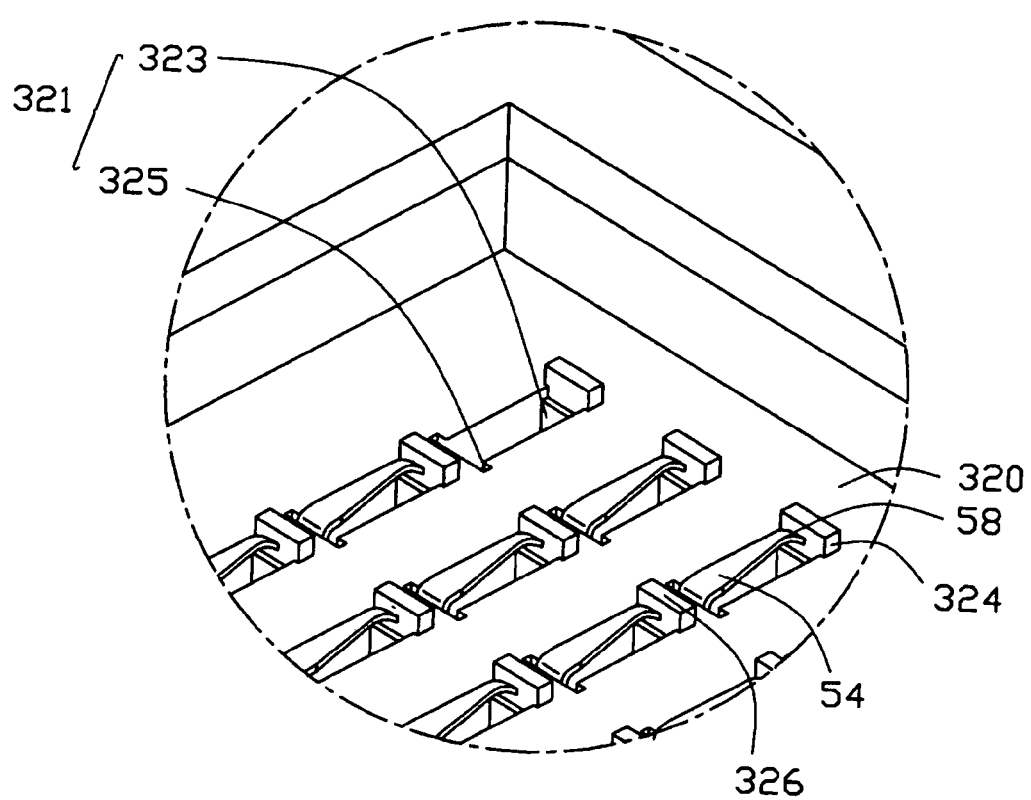
FIG. 2 is an enlarged, isometric view of one terminal of FIG. 1

Referring also to FIG. 2, a top surface 320 is formed on a top of the bottom wall 32, for supporting the CPU chip 80 thereon. A bottom surface 322 is formed on a bottom of the bottom wall 32, for being mounted on the PCB 90. A plurality of passageways 321 arranged in array is defined in the bottom wall 32. The passageways 321 extend from the top surface 320 to the bottom surface 322, for receiving the terminals 50 respectively therein. Each passageway 321 has a general T-shaped configuration, and includes a large receiving section 323 and a narrow securing section 325 perpendicular to and in communication with the receiving section 323.

Referring best to FIGS. 2 and 4 to 7, a plurality of parallelepiped protrusions 324 is formed on the housing 30, projecting integrally and upwardly from the top surface 320 of bottom wall 32. The protrusions 324 have a common top-supporting surface 326 for engaging sustaining the CPU chip 80 thereon when the CPU chip 80 is secured in the cavity 31 of the housing 30. In addition, the protrusions 324 each have a uniform vertical height relative to the top surface 322, in a thickness direction of the bottom wall 32. Thereby, the CPU chip 80 can steadily sit on the protrusions 324. The protrusion 324 is located around a corresponding passageway 321 at one side near the receiving section 323 of the passageway 321 and opposing to the securing section 325.

Figure 3:
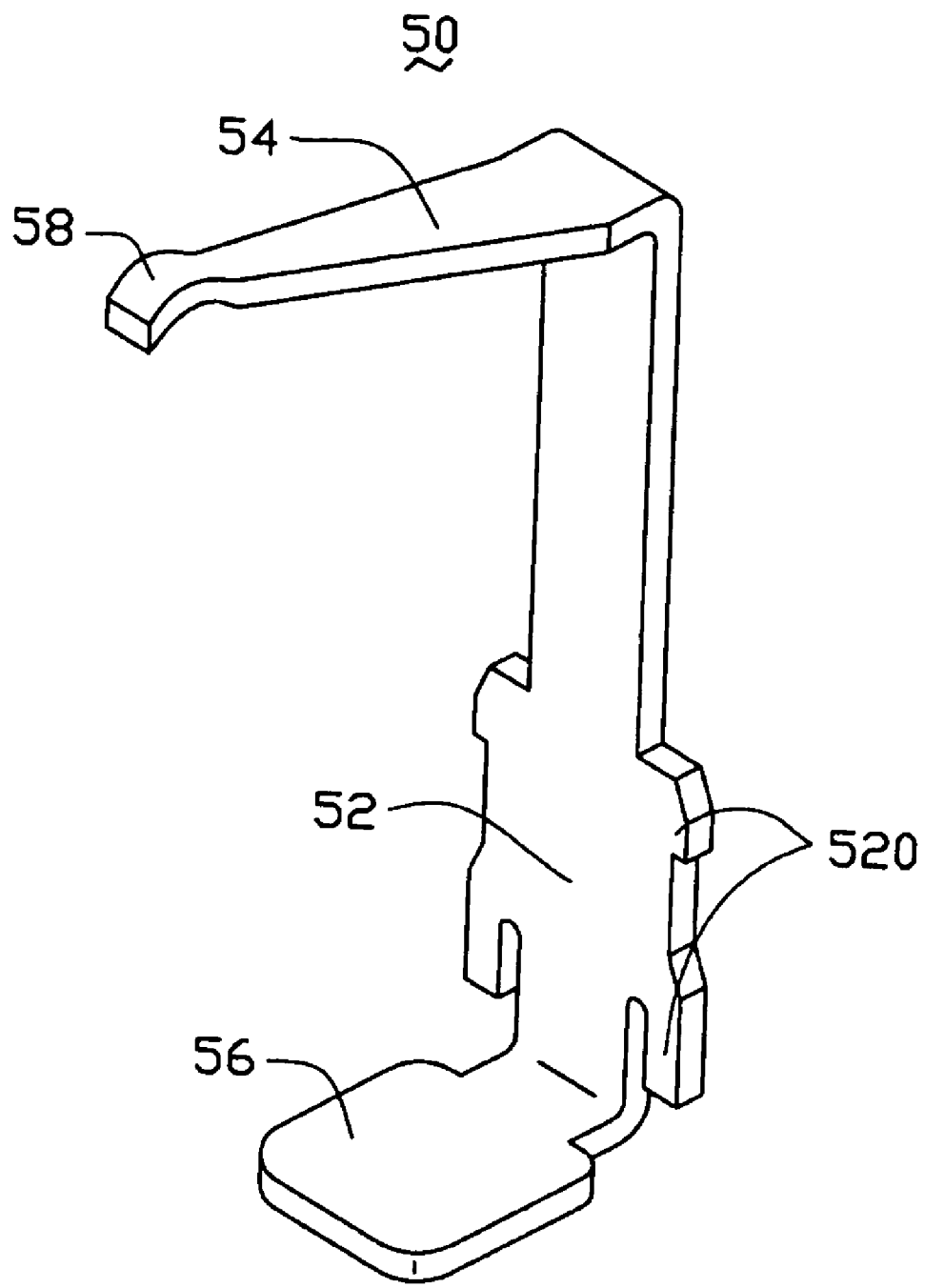
FIG. 3 is an enlarged view of a circled portion III of FIG. 1.

Referring to FIG. 3, the terminals 50 are formed from conductive material by known stamping process. Each terminal 50 has a vertical plate-like retention portion 52, a cantilever-shaped spring arm 54 extending upwardly from a top of the retention portion 52, and a tail portion 56 extending downwardly from a bottom of the retention portion 52. A plurality of barbs 520 is formed on opposite lateral sides of the retention portion 52, for interferingly engaging inner sides of the securing section 325 of a corresponding passageway 321. The tail portion 56 is substantially perpendicularly bent from the bottom of the retention portion 52, for electrically engaging a corresponding contact pad (not showed) on the PCB 90 via a soldering ball 92.

The spring arm 54 includes a vertical first extending section 52A extending upwardly from the top of the retention portion 52, and a general horizontal second extending section 54B bent slantwise from a top end of the first extending portion 54A. The second extending section 54B has a substantially taper configuration, with a sectional width becoming gradually smaller and smaller from a start end adjacent the first extending section 54A to a free end thereof. A contacting portion 58 is formed at the free end of the second extending section 54B, with its distal end facing downwardly. The contacting portion 58 is located at a topmost part of the spring arm 50 and has an arced or curved upper surface (not numbered), for electrically engaging a corresponding pad 82 formed on a bottom of the CPU chip 80.

In assembly, the terminal 50 is loaded from a top of the housing 30 into a corresponding passageway 321, with the tail portion 56 going through the receiving section 325 of the passageway 321. The retention portion 52 is planted in the securing section 323 of the passageway 321, the barbs 520 engagingly intervening the inner side of the securing section 323. Thus the terminal 50 is firmly retained in the passageway 321.

After assembly, the second extending section 54B of the spring arm 54 partly projects from the receiving section 323 beyond the top surface 320 of the housing 30 and below the supporting surface 326 of the protrusions 324. As best seen FIG. 5, the supporting surface 326 of the protrusions 324 is higher a vertical distance h than the contacting portion 58 of the terminal 50 in a direction perpendicular to the top surface 320. From a top elevation aspect of the connector, the protrusion 324 is close to the contacting portion 58.

Because the contacting portion 58 of the spring arm 54 is lower than the supporting surface 326 of the protrusion 324, when the connector 10 is improperly collided by exterior objects from the top of the housing 30, the protrusions 324 can resist the exterior objects. And this thereby can avoid the contacting portion 58 from being damaged because of the undue force generated during the colliding. In addition, in this preferred embodiment, the protrusion 324 is located at the side of the corresponding passageway 321, near the receiving section 323 of the passageway 321. And from a top elevation aspect of the connector, the protrusion 324 is close to the contacting portion 58. This can protect the contacting portion 58 of the terminal 50 from being damaged more effectively.

In use, the connector 10 is electrically mounted on the PCB 90, the tail portion 56 of the terminal 50 connecting with the soldered ball 92. The CPU chip 80 is inserted into the cavity 31 of the housing 30, with each pad 82 of the CPU chip 80 seating and pressing on the contacting portion 58 of a corresponding terminal 50. The CPU chip 80 is pressed down by exterior force until the bottom of the CPU chip 80 is fully and steadily sustained on the supporting surface 326 of the protrusions 324 of the housing 30. The pad 82 of the CPU chip 80 has a bottom face pressed the contacting portion 58 of the terminal to urge the spring arm 54 to resiliently deform down. Thus the CPU chip 80 is electrically connected with the connector 10.

The above-described embodiment shows that the protrusion 324 is located around a corresponding passageway 321 and has a parallelepiped configuration, but it is not limited thereto. The protrusion 324 may have other shapes or configuration, e.g. step-like projection and so on, provided that those kinds of protrusions 324 each can provide the supporting surface 326 above the top surface 320 a determined height and avoid from intervening with the contacts 50. And this thereby avoids colliding and scraping damage of the housing 10 by motion of the CPU chip. As a result, effective electrical connection between the CPU chip 60 and the contacts 12 of the connector is secured.

While the present invention has been described with reference to a preferred embodiment, the description is illustrative and is not to be construed as limiting the invention. Therefore, various equivalent modifications and changes known to persons skilled in the art according to the spirit of the present invention are considered within the scope of the present invention as defined in the appended claims.

What is claimed is:

1. An electrical connector for electrically connecting an electronic package comprising:
   an insulative housing defining a top surface and a plurality of passageways extending downwardly from the top surface;
   a plurality of terminals received in the passageways, respectively; the terminals each having a retention portion secured in a corresponding passageway, a spring arm extending from the retention portion beyond the top surface and a contacting portion formed on the spring arm above the top surface a distance for electrically connecting with the package; and
   protrusions formed on the top surface, said protrusions cooperatively forming a supporting surface, the supporting surface being higher than the contacting portion in a direction perpendicular the top surface;
   wherein the protrusions integrally project from the top surface, the protrusions respectively being situated around a corresponding passageway;
   wherein the passageways each define a securing section and a receiving section perpendicular to and in communication with the securing section;
   wherein the protrusions are located at one side of the receiving section of the corresponding passageway opposite to the securing section;
   wherein the protrusions each have a parallelepiped configuration;
   wherein the spring arm of the terminal has a first section connected to the retention portion and a second section bent from the first section, the second having a tapered configuration.

* * * * *